US012588487B2

(12) United States Patent　　　(10) Patent No.:　US 12,588,487 B2
Lanzillo et al.　　　　　　　　　(45) Date of Patent:　Mar. 24, 2026

(54) TIGHT PITCH DIRECTIONAL SELECTIVE VIA GROWTH

(71) Applicant: International Business Machines Corporation, Armonk, NY (US)

(72) Inventors: Nicholas Anthony Lanzillo, Wynantskill, NY (US); Koichi Motoyama, Clifton Park, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 18/211,283

(22) Filed: Jun. 18, 2023

(65) Prior Publication Data

US 2024/0421069 A1　　Dec. 19, 2024

(51) Int. Cl.
　　*H10W 20/42*　　(2026.01)
　　*H10W 20/00*　　(2026.01)
　　*H10W 20/41*　　(2026.01)
(52) U.S. Cl.
　　CPC .........　*H10W 20/42* (2026.01); *H10W 20/081* (2026.01); *H10W 20/425* (2026.01)
(58) Field of Classification Search
　　CPC ........... H01L 23/5226; H01L 23/53223; H01L 23/53238; H01L 21/76885; H01L 21/76897; H10W 20/42; H10W 20/435; H10W 20/0693; H10W 20/081; H10W 20/425
　　See application file for complete search history.

(56) References Cited

U.S. PATENT DOCUMENTS

| | | | |
|---|---|---|---|
| 7,879,720 B2 * | 2/2011 | Jang | ................... H01L 21/76804 |
| | | | 438/678 |
| 8,617,982 B2 | 12/2013 | Danek | |
| 9,236,292 B2 | 1/2016 | Romero | |
| 9,391,019 B2 | 7/2016 | Kobrinsky | |
| 9,613,861 B2 | 4/2017 | Anderson | |
| 10,177,028 B1 * | 1/2019 | LiCausi | ........... H01L 21/76883 |
| 10,256,186 B2 | 4/2019 | Bonilla | |
| 10,777,452 B2 | 9/2020 | Ho | |
| 11,444,024 B2 | 9/2022 | Lin | |
| 2003/0157788 A1 * | 8/2003 | Honeycutt | ........ H01L 21/76852 |
| | | | 257/E21.589 |
| 2009/0053889 A1 * | 2/2009 | Hong | .................... H01L 23/485 |
| | | | 438/643 |
| 2017/0287775 A1 * | 10/2017 | Tsai | .................. H01L 21/76807 |
| 2021/0167004 A1 * | 6/2021 | Seo | ......................... H10D 30/60 |
| 2021/0296164 A1 * | 9/2021 | Motoyama | .......... H01L 23/5283 |
| 2022/0223518 A1 | 7/2022 | Karpov | |

(Continued)

FOREIGN PATENT DOCUMENTS

EP　　　　4057327 A1　　9/2022

*Primary Examiner* — Bac H Au
(74) *Attorney, Agent, or Firm* — Aaron N. Pontikos

(57)　　　　　ABSTRACT

A semiconductor interconnect structure and formation thereof. The semiconductor interconnect structure includes a subtractively formed via located on top of a lower level metal line. The subtractively formed via has a bottom portion and a top portion. The semiconductor interconnect structure further includes a selectively grown region formed onto the top portion of the subtractively formed via. A portion of the selectively grown region overhangs the bottom portion of the subtractively formed via in one or more directions.

18 Claims, 13 Drawing Sheets

(56)  References Cited

U.S. PATENT DOCUMENTS

2022/0293516 A1      9/2022  Wei
2022/0392838 A1*  12/2022  Motoyama ........ H01L 23/53266
2022/0415710 A1*  12/2022  Reid  ........................ C25D 5/18
2022/0415791 A1    12/2022  Guler
2023/0066614 A1*    3/2023  Clevenger ............. H01L 23/528
2024/0332165 A1*  10/2024  Xie  .................. H01L 21/76831

* cited by examiner

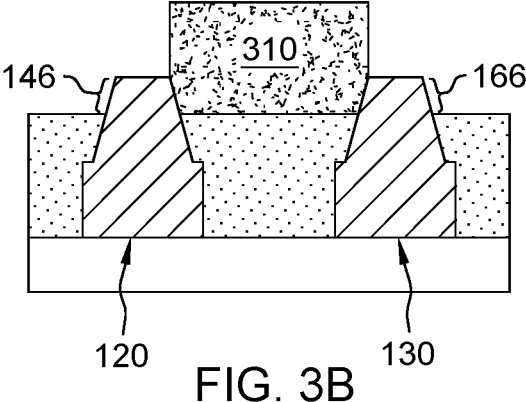
146          310          166
120          FIG. 3B          130
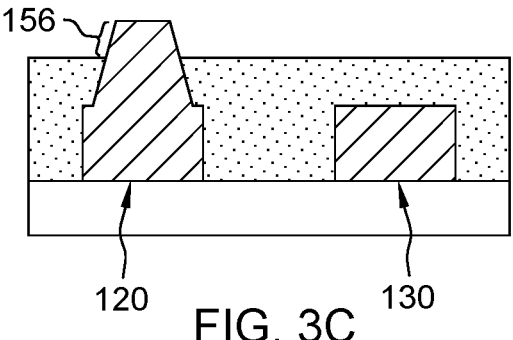
156
120          FIG. 3C          130

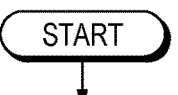

FORM A FIRST METAL LINE AND A VIA ON TOP OF THE FIRST METAL LINE ⟋ 702

DEPOSIT A FIRST CONDUCTIVE METAL MATERIAL ONTO A SUBSTRATE ⟋ 704

PERFORM ONE OR MORE SUBTRACTIVE ETCH PROCESSES TO PATTERN THE FIRST CONDUCTIVE METAL MATERIAL INTO THE FIRST METAL LINE AND THE VIA FORMED THEREON ⟋ 706

DEPOSIT AN INTERLAYER DIELECTRIC (ILD) TO FORM AN ILD LAYER ⟋ 708

⟋ 710

CONFORMALLY DEPOSIT AN ILD MATERIAL ONTO THE FIRST METAL LINE AND VIA

REMOVING ANY ILD MATERIAL FORMED ABOVE A TOP SURFACE OF THE VIA ⟋ 712

PARTIALLY RECESS THE ILD LAYER BELOW THE TOP SURFACE OF THE VIA ⟋ 714

ENLARGE A TOP PORTION OF THE VIA LOCATED ABOVE THE ILD LAYER IN ONE OR MORE DIRECTIONS ⟋ 716

DEPOSIT A MASK MATERIAL AND PATTERN THE MASK MATERIAL TO FORM A BLOCK MASK, WHEREIN THE BLOCK MASK IS PATTERNED SUCH THAT THE BLOCK MASK COVERS A FIRST PORTION OF THE TOP PORTION OF THE VIA ⟋ 718

DEPOSIT, USING AREA SELECTIVE DEPOSITION, A SECOND CONDUCTIVE METAL MATERIAL ONTO A SECOND PORTION OF THE TOP PORTION OF THE VIA LEFT EXPOSED BY THE BLOCK MASK TO FORM A SELECTIVE GROWTH REGION ⟋ 720

FORM A SECOND METAL LINE ON TOP OF THE SELECTIVE GROWTH REGION OF THE VIA ⟋ 722

OPTIONALLY CONFORMALLY DEPOSIT A BARRIER MATERIAL TO FORM A PROTECTIVE LINER ⟋ 724

⟋ 726

DEPOSIT A THIRD CONDUCTIVE METAL MATERIAL ONTO THE PROTECTIVE LINER

PERFORM ONE OR MORE SUBTRACTIVE ETCH PROCESSES TO PATTERN THE THIRD CONDUCTIVE MATERIAL INTO THE SECOND METAL LINE ⟋ 728

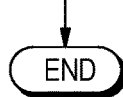

FIG. 7

TIGHT PITCH DIRECTIONAL SELECTIVE VIA GROWTH

BACKGROUND

The present disclosure generally relates to fabrication methods and structures for semiconductor devices, and more specifically, to directional selective via growth to increase the via-to-line contact area in tight pitch interconnect fabrication.

An integrated circuit (IC) device may be formed with millions of transistors and other circuit elements that are fabricated on a single silicon crystal substrate (wafer). For the IC device to be functional, multi-level or multi-layered interconnection schemes such as, for example, metal wiring formed by single damascene processes, dual damascene processes, subtractive patterning (i.e., subtractive etch processes), and combinations thereof, are fabricated in the back-end-of-the-line (BEOL) of the device to connect the circuit elements distributed in the front-end-of-the-line (FEOL) of the device. Connections between interconnect levels, called vias, allow signals and power to be transmitted between one level to the next.

SUMMARY

According to one embodiment of the present invention, a semiconductor interconnect structure is provided. The semiconductor interconnect structure includes a subtractively formed via located on top of a lower level metal line. The subtractively formed via has a bottom portion and a top portion. The semiconductor interconnect structure further includes a selectively grown region formed onto the top portion of the subtractively formed via. A portion of the selectively grown region overhangs the bottom portion of the subtractively formed via in one or more directions.

According to another embodiment of the present invention, a method of forming a semiconductor interconnect structure is provided. The method includes forming a via on top of a lower level metal line using subtractive patterning. The method further includes depositing an interlayer dielectric material to form an interlayer dielectric layer. The interlayer dielectric layer is recessed below a top surface of the via. The method further includes directionally enlarging a top portion of the via located above the interlayer dielectric layer in one or more directions.

BRIEF DESCRIPTION OF THE SEVERAL VIEWS OF THE DRAWINGS

FIG. 3B illustrates a cross-sectional view of semiconductor structure 300 taken along line 3B, in accordance with at least one embodiment of the present invention.

FIG. 3C illustrates a cross-sectional view of semiconductor structure 300 taken along line 3C, in accordance with at least one embodiment of the present invention.

FIG. 7 is flowchart diagram depicting a method 700 of fabricating a semiconductor interconnect structure corresponding to the semiconductor structures described with reference to FIGS. 1A-1C . . . 6A-6C, in accordance with at least one embodiment of the present invention.

DETAILED DESCRIPTION

Figure 1A:
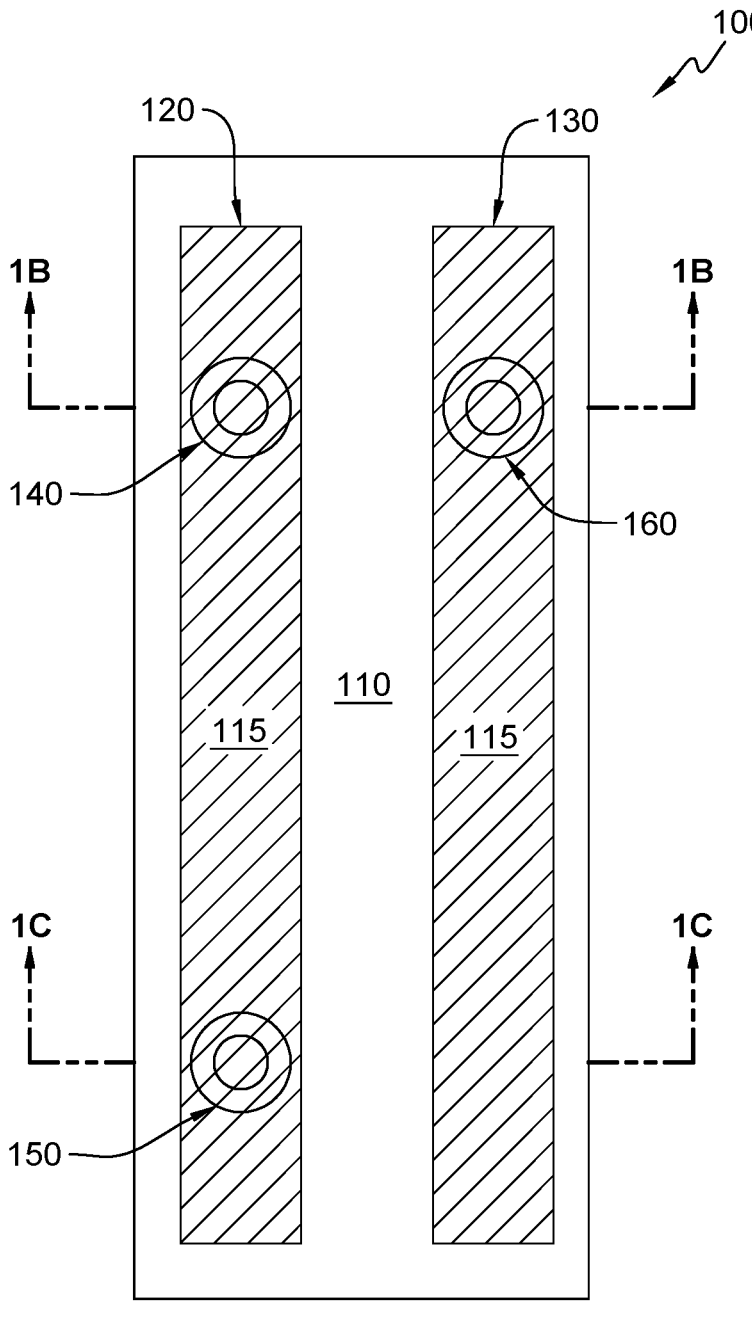
FIG. 1A illustrates a top view of an initial semiconductor interconnect structure, generally designated 100, in accordance with at least one embodiment of the present invention.

In conventional back-end-of-the-line (BEOL) metal wiring schemes, vias are typically formed on top of and aligned with underlying metal lines in order to maximize overlap and thereby reduce contact resistance. For tight pitch interconnect wiring schemes, the size (and thus the contact area) of the vias may be reduced in order to maintain a minimum required pitch between vias. This ultimately stems from the fact that even a slight increase in via size at tight pitches can increase the risk of shorting to a neighboring metal line. However, embodiments of the present invention recognize that the reduction in size (and thus contact area) of vias does not come without a tradeoff. By decreasing the via-to-line contact area, the contact resistance between the via and line is increased, thereby causing reliability concerns.

Embodiments of the present invention provide for improved interconnect structures and methods of forming the same for interconnect wiring schemes having tight pitch vias. According to embodiments of the present invention, the via-to-line contact areas for tight pitch vias formed by subtractive patterning is increased by directional selective growth of a top portion of a via. By controlling the direction of the selective growth of a top portion of a via, the via-to-line contact area of the via may be selectively increased in those directions that are not bound by minimum pitch requirements. This increase in via-to-line contact area in specific directions allows for reduced contact resistance without an increased risk for shorting concerns to neighboring lines, thereby ultimately preserving time dependent dielectric breakdown (TDDB) integrity at minimum pitch regions.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, terms such as "depositing," "forming," and the like may refer to the disposition of layers, or portions of materials, in accordance with a given embodiment. Such processes may or may not be different than those used in the standard practice of the art of microcooler device fabrication. Such processes include, but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, electroplating, evaporation, ion beam deposition, electron beam deposition, laser assisted deposition, chemical solution deposition, or any combination of those methods.

As used herein, terms, such as "forming," and the like, may refer to processes that alter the structure and/or composition of one or more layers of material or portions of materials in accordance with a given embodiment. For example, such formation processes may include, but are not limited to, exposure to a specific frequency or range of frequencies of electromagnetic radiation, ion implantation techniques, and/or chemical/mechanical polishing (CMP). As used herein, terms, such as "forming," and the like, may refer to processes that alter the structure of one or more layers of material, or portions of material(s), by removal of a quantity of material, in accordance with a given embodiment. For example, such formation processes may include, but are not limited to, micromachining, microetching, wet and/or dry etching processes, plasma etching processes, or any of the known etching processes in which material is removed.

As used herein, the terms "metal level," "metal layer," "interconnect level," and "interconnect layer" may be used interchangeably and may refer to one of a plurality of metal wiring levels in the BEOL of an integrated circuit (IC).

As used herein, the term "source/drain contact" may refer to a contact that extends from below a transistor to make electrical contact to a source region and/or drain region of the transistor.

As used herein, the term "contact via" may refer to a lowest level via of the BEOL of an integrated circuit (IC) used to make an electrical connection between a source/drain contact and a metal line in a lowest metal level of the BEOL.

Figure 1B:
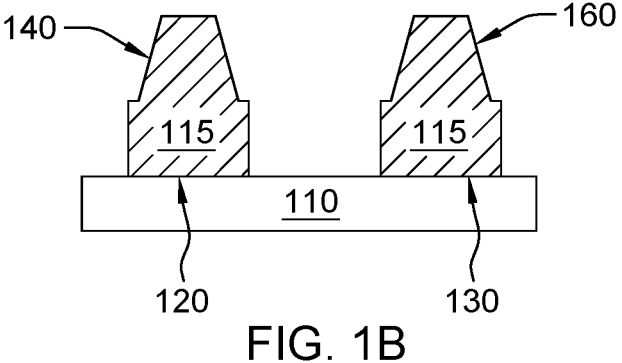
FIG. 1B illustrates a cross-sectional view of semiconductor structure 100 taken along line 1B, in accordance with at least one embodiment of the present invention.
Figure 1C:
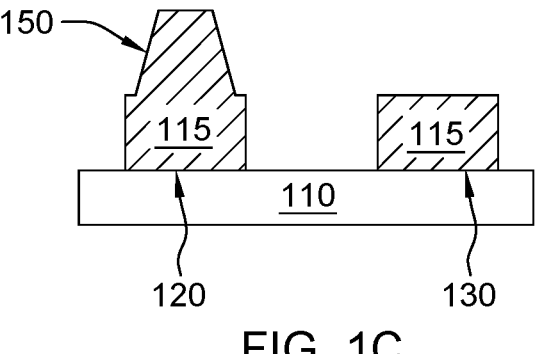
FIG. 1C illustrates a cross-sectional view of semiconductor structure 100 taken along line 1C, in accordance with at least one embodiment of the present invention.

The present invention will now be described in detail with reference to the Figures. FIGS. 1A-1C . . . 6A-6C include various views depicting illustrative steps of a method for manufacturing semiconductor interconnect structures and the resulting semiconductor interconnect structures according to select embodiments of the present invention. One having ordinary skill in the art will appreciate that there are many options available for the formation of the structures described herein and that the following discussion does not limit embodiments to only the techniques described herein.

FIGS. 1A-1C illustrate a top view and corresponding cross-sectional views of an initial semiconductor structure 100, in accordance with at least one embodiment of the present invention. Referring to the top view of FIG. 1A and the cross-sectional views of FIGS. 1B, 1C taken along corresponding lines 1B, 1C, elements 120, 130 are formed on a substrate 110, and elements 140, 150, 160 are formed on top of elements 120, 130.

In some embodiments, substrate 110 may be part of a front-end-of-the-line (FEOL) structure. A FEOL structure is typically present beneath the lowest level of the multilayered interconnect structure and includes a semiconductor substrate having one or more semiconductor devices such as, for example, transistors, capacitors, resistors, and etc. located thereon. In other embodiments, substrate 110 may include one or more interconnect levels of a multilayered interconnect structure, such as a back-end-of-the-line (BEOL) structure. A BEOL structure is typically where the individual semiconductor devices in the FEOL structure are interconnected with one another. In such embodiments, each interconnect level (i.e., metal level) may include one or more electrically conductive structures embedded in an interconnect dielectric material. For example, the one or more interconnect levels of a multilayer interconnect structure may be formed from any generally known semiconductor materials, such as silicon, gallium arsenide, or germanium.

In some embodiments, and as depicted in FIGS. 1A-1C, substrate 110 is a bulk semiconductor wafer, such as a bulk silicon (Si), bulk germanium (Ge), bulk silicon germanium (SiGe) and/or bulk III-V semiconductor wafer. Alternatively, in other embodiments, substrate 110 is a semiconductor-on-insulator (SOI) wafer. A SOI wafer includes a SOI layer separated from a substrate by a buried insulator. When the buried insulator is an oxide, it is referred to herein as a buried oxide or BOX. The SOI layer can include any suitable semiconductor, such as Si, Ge, SiGe, and/or a III-V semiconductor.

In some embodiments, and as depicted in FIGS. 1A-1C, elements 120, 130 are representative of a first set of metal lines of a first metal wiring level, and elements 140, 150, 160 are representative of a first set of vias. In other embodiments, elements 120, 130 are representative of a first set of source/drain contacts and elements 140, 150, 160 are representative of a first set of contact vias.

For discussion purposes only, and unless otherwise specified herein, elements 120, 130 shall be referred to as metal lines 120, 130 and elements 140, 150, 160 shall be referred to as vias 140, 150, 160. However, the illustrated operations of FIGS. 1A-1C . . . 6A-6C will be understood to be similarly applicable to elements 120, 130 and elements 140, 150, 160 being representative of source/drain contacts and contact vias, respectively. Moreover, any operations, features, benefits, etc. that are described with respect to a particular fabrication sequence corresponding to elements 120, 130 being representative of metal lines and elements 140, 150, 160 being representative of vias will be understood to be similarly applicable to elements 120, 130 being representative of source/drain contacts and elements 140, 150, 160 being representative of contact vias, unless explicitly noted.

In assembly of semiconductor structure 100, a conductive metal layer 115 is formed by depositing a conductive metal material (e.g., via physical vapor deposition (PVD), atomic layer deposition (ALD), chemical vapor deposition (CVD), plasma enhanced CVD (PECVD), or any other suitable deposition techniques) onto the top surface of substrate 110. In an embodiment, the conductive metal material may be a metal or metal alloy including, but not limited to, aluminum (Al), ruthenium (Ru), rhodium (Rh), iridium (Ir), tungsten (W), molybdenum (Mo), nickel (Ni), or an alloy thereof.

Next, one or more subtractive etch processes are performed to pattern conductive metal layer 115 to form metal lines 120, 130 and vias 140, 150, 160 on top thereof. For example, a mask layer (not depicted) is formed by depositing an inorganic hard mask material (e.g., silicon nitride, titanium nitride, tantalum nitride, or any suitable inorganic metal-containing material) or an organic soft mask material (e.g., carbon, hydrogen, oxygen, and optionally nitrogen, fluorine, and silicon) onto the top surface of conductive metal layer 115. The mask layer can be formed utilizing a deposition process including, but not limited to, CVD, PECVD, ALD, physical vapor deposition (PVD) or sputtering.

A photoresist material (not depicted) is then deposited onto the surface of the mask layer. The photoresist material can be applied by any suitable techniques, including, but not limited to, coating or spin-on techniques. A photomask (not depicted) patterned with shapes defining metal lines 120, 130 and vias 140, 150, 160 to be formed is placed over the photoresist material, and the photomask pattern is transferred to the photoresist material using a lithographic process, which creates recesses in the uncovered regions of the photoresist material. The resulting patterned photoresist material is subsequently used to create the same pattern in the mask layer. One or more etch processes may be employed to selectively remove portions of the mask layer to form the patterned mask. After formation of the patterned mask, the photoresist material may be stripped from the patterned mask by ashing or other suitable processes. The resulting structure may be subjected to a wet clean.

During patterning of conductive metal layer 115 using the patterned mask, the physically exposed portions of conductive metal layer 115 are removed by an anisotropic etching process such as, for example, reactive ion etching (RIE), ion beam etching (IBE), chemical wet etching, or a combination of IBE and chemical wet etching. The etch removes the exposed portions of conductive metal layer 115 that are not protected by the patterned mask to form metal lines 120, 130 and vias 140, 150, 160. It should be appreciated that unlike single or dual damascene processes, in which vias are formed below metal lines, vias 140, 150, 160 are formed on top of metal lines 120, 130 as a result of performing one or more subtractive etch processes to pattern conductive metal layer 115. Similarly, in embodiments where elements 120, 130 are representative of source/drain contacts, and elements 140, 150, 160 are representative of contact vias, contact vias 140, 150, 160 are formed on top of source/drain contacts 120, 130 as a result of performing the one or more subtractive etch processes to pattern conductive metal layer 115.

It should be appreciated that although metal lines 120, 130 and vias 140, 150, 160 are described above as being formed by subtractive patterning of a metal or metal alloy, in other embodiments of the present invention, metal lines 120, 130 and vias 140, 150, 160 may be formed using a single damascene or dual damascene process as known by one of ordinary skill in the art. In those instances where metal lines 120, 130 and vias 140, 150, 160 are formed using a single damascene or dual damascene process, the conductive metal material of conductive metal material 115 may further include copper (Cu) or an alloy thereof.

Figure 2A:
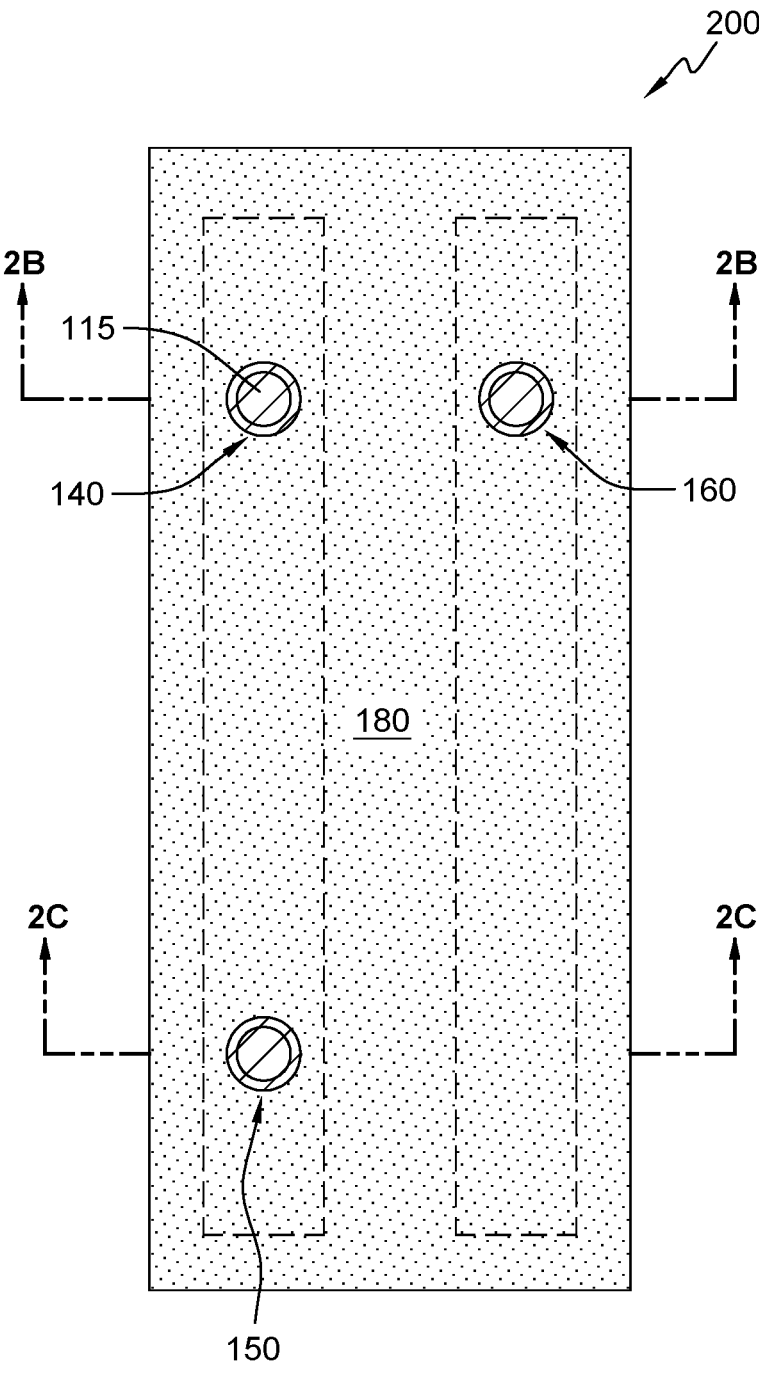
FIG. 2A illustrates a top view of semiconductor structure 100 after performing subsequent processing steps, generally designated 200, in accordance with at least one embodiment of the present invention.
Figures 2B, 2C:
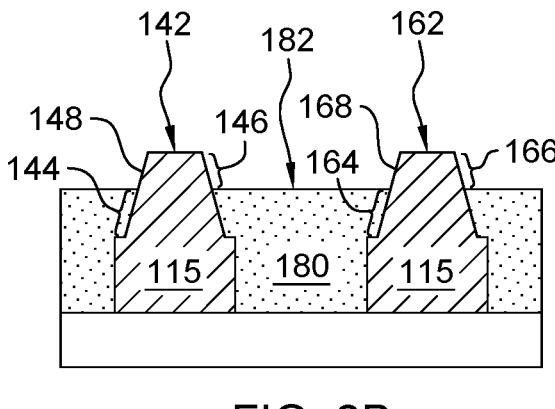
FIG. 2B illustrates a cross-sectional view of semiconductor structure 200 taken along line 1B, in accordance with at least one embodiment of the present invention.
FIG. 2C illustrates a cross-sectional view of semiconductor structure 200 taken along line 2C, in accordance with at least one embodiment of the present invention.

FIGS. 2A-2C illustrate a top view and corresponding cross-sectional views of semiconductor structure 100 depicted in FIGS. 1A-1C after performing subsequent processing steps, generally designated 200, in accordance with at least one embodiment of the present invention. In assembly of semiconductor structure 200, and referring to the top view of FIG. 2A and the cross-sectional views of FIGS. 2B, 2C taken along corresponding lines 2B, 2C, an interlayer dielectric (ILD) material is conformally deposited onto the patterned conductive metal layer 115 to form ILD layer 180, followed by a partial recess of ILD layer 180. ILD layer 180 may be formed by depositing an ILD material using known techniques including, but not limited to, chemical vapor deposition (CVD), plasma enhanced chemical vapor deposition (PECVD), atomic layer deposition (ALD), physical vapor deposition (PVD), sputtering, chemical solution deposition, or any other suitable deposition techniques.

ILD layer 180 may be composed of an inorganic dielectric material or an organic dielectric material. In some embodiments, ILD layer 180 may be porous. In other embodiments, ILD layer 180 may be non-porous. In some embodiments, ILD layer 180 may have a dielectric constant (all dielectric constants mentioned herein are measured relative to a vacuum, unless otherwise stated) that is about 4.0 or less. In an embodiment, ILD layer 180 may have a dielectric constant of 2.8 or less. These dielectrics having a dielectric constant of 2.8 or less generally have a lower parasitic cross talk as compared to dielectric materials whose dielectric constant is greater than 4.0. Examples of suitable dielectric materials that may be employed as ILD layer 180 include, but are limited to, porous silicates, silicon dioxides, silicon oxynitrides, silicon carbides, silicon nitrides, silicon undoped or doped silicate glass, silsesquioxanes, carbon doped oxides (i.e., organosilicates) that include atoms of Si, C, O and H, and variants thereof, siloxanes, thermosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

A planarization process such as, for example, chemical mechanical planarization or polishing (CMP) and/or grinding, may subsequently be performed to remove portions of ILD layer 180 present above top surfaces 142, 152, 162 of vias 140, 150, 160. The planarization stops when top surface 182 of ILD layer 180 is substantially coplanar with top surfaces 142, 152, 162 of vias 140, 150, 160.

Next, ILD layer 180 is partially recessed below top surfaces 142, 152, 162 of vias 140, 150, 160. ILD layer 180 may be partially recessed by performing an etching process (e.g., dry etching, wet etching, or a combination of dry and wet etching) that is selective to the material(s) of ILD layer 180 over the material(s) of vias 140, 150, 160. As depicted by FIGS. 2A-2C, the partial recess of ILD layer 180 results in bottom portions 144, 154, 164 of vias 140, 150, 160 being recessed within, and located below top surface 182 of ILD layer 180, while top portions 146, 156, 166 of vias 140, 150, 160 are located above top surface 182 of ILD layer.

Recessing ILD layer 180 below top surfaces 142, 152, 162 of vias 140, 150, 160 further results in the exposure of sidewalls 148, 158, 168. It should be appreciated that the exposure of sidewalls 148, 158, 160 allows for the subsequent growth of top portions 144, 154, 166 of vias 140, 150, 160 in a lateral direction by performing area selective deposition on sidewalls 148, 158, 168. On the other hand, if ILD layer 180 was not recessed below the top surfaces of vias 140, 150, 160, any subsequent selective growth would be limited to a vertical direction, since area selective deposition would only be able to be performed on top surfaces 142, 152, 162 of vias 140, 150, 160.

The extent to which ILD layer 180 is recessed can be controlled by a timed etching process, and may vary based on the given application. Accordingly, in various embodiments, partially recessing ILD layer 180 may result in top surface 182 of ILD layer 180 being closer to or further from top surfaces 142, 152, 162 of vias 140 150, 160. In some embodiments, the extent to which ILD layer 180 is recessed can be increased or decreased based on a desired amount of exposed surface area of vias 140, 150, 160 for subsequent directional selective metal growth thereon.

Figure 3A:
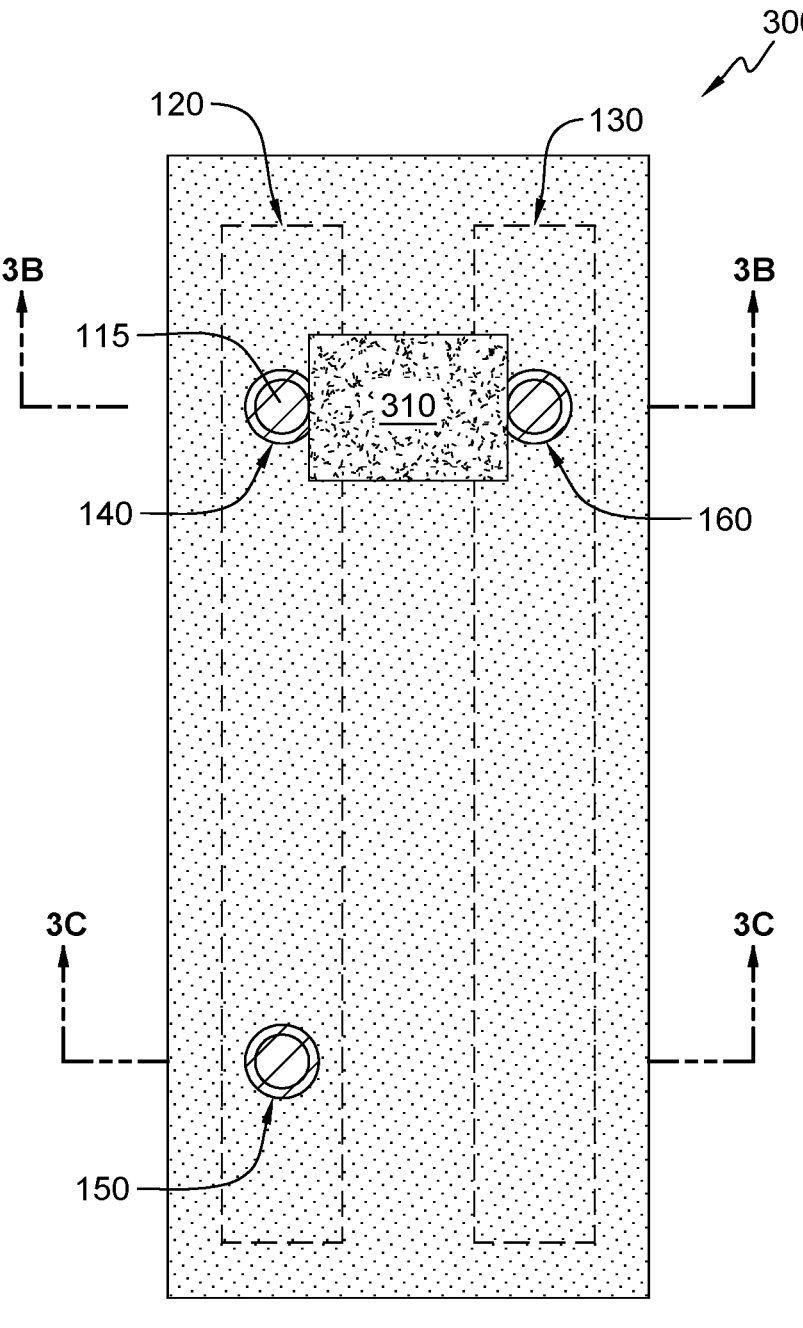
FIG. 3A illustrates a top view of semiconductor structure 200 after performing subsequent processing steps, generally designated 300, in accordance with at least one embodiment of the present invention.

FIGS. 3A-3C illustrate a top view and corresponding cross-sectional views of semiconductor structure 200 depicted in FIGS. 2A-2C after performing subsequent processing steps, generally designated 300, in accordance with at least one embodiment of the present invention. In assembly of semiconductor structure 300, and referring to the top view of FIG. 3A and the cross-sectional views of FIGS. 3B, 3C taken along corresponding lines 3B, 3C, a mask material is deposited onto semiconductor structure 200 (depicted in FIGS. 2A-2C), followed by the patterning of the mask material to form a block mask 310.

Block mask 310 may be formed by depositing a mask material using known techniques including, but not limited to, spin-on coating, chemical vapor deposition (CVD), plasma enhanced chemical vapor deposition (PECVD), atomic layer deposition (ALD), physical vapor deposition (PVD), sputtering, or chemical solution deposition. In some embodiments, and as depicted in FIGS. 3A-3C, block mask 310 is a hard mask formed from an inorganic hard mask material. In other embodiments, block mask 310 is a soft mask formed from an organic soft mask material.

As depicted, the mask material has been patterned into block mask 310 using, for example, the same processes and materials used to form the patterned mask as described above with reference FIGS. 1A-1C. The block mask 310, which acts as an area selective deposition inhibitor, is formed such that any subsequent area selective metal growth is prevented from forming on the areas of top portions 246, 266 of vias 140, 160 covered by the patterned mask layer 310, while any subsequent area selective metal growth is permitted to form on the areas of top portions 146, 156, 166 of vias 140, 150, 160 that remain exposed.

It should be appreciated that block mask 310 is not limited to the particular arrangement as depicted in FIGS. 3A-3C, and may be patterned based on the particular via routing scheme, such that selective metal growth is permitted to occur in one or more lateral directions that are not bound by minimum pitch requirements, and prevented from occurring in one or more lateral directions that would violate any minimum pitch requirements. For example, and as depicted in FIGS. 3A-3C, vias 140, 160 are formed on adjacent underlying metal lines 120, 130, and are at least partially aligned with one another in the line direction of metal lines 120, 130. Assuming that vias 140, 160 are already at the minimum allowable pitch, then mask layer 310 is patterned such that any subsequent selective metal growth onto the exposed surfaces of top portions 146, 156, 166 does not violate the minimum allowable pitch between vias 140, 160. In other words, mask layer 310 is patterned such that any subsequent selective metal growth does not reduce the distance between vias, 140, 160. Accordingly, and as depicted in FIGS. 3A-3C, mask layer 310 is patterned such that any subsequent selective metal growth formed on the exposed surfaces of top portions 146, 166 of vias 140, 160 does not extend in any direction that would further reduce the distance between vias 140, 160.

In another example, and as depicted in FIGS. 3A-3C, via 150 is formed on top of underlying metal line 120. Assuming that pitch 320 exceeds the minimum required pitch between vias 140 and 150, and that any subsequent selective metal growth on top portion 156 that would extend in a lateral direction towards via 140 will not violate the minimum allowable pitch, then mask layer 310 is patterned such that the entire surface of top portion 156 of via 150 is left exposed. In this example, any subsequent metal growth on top portion 156 of via 150 would extend laterally in all directions (i.e., 360 degrees).

Figure 4A:
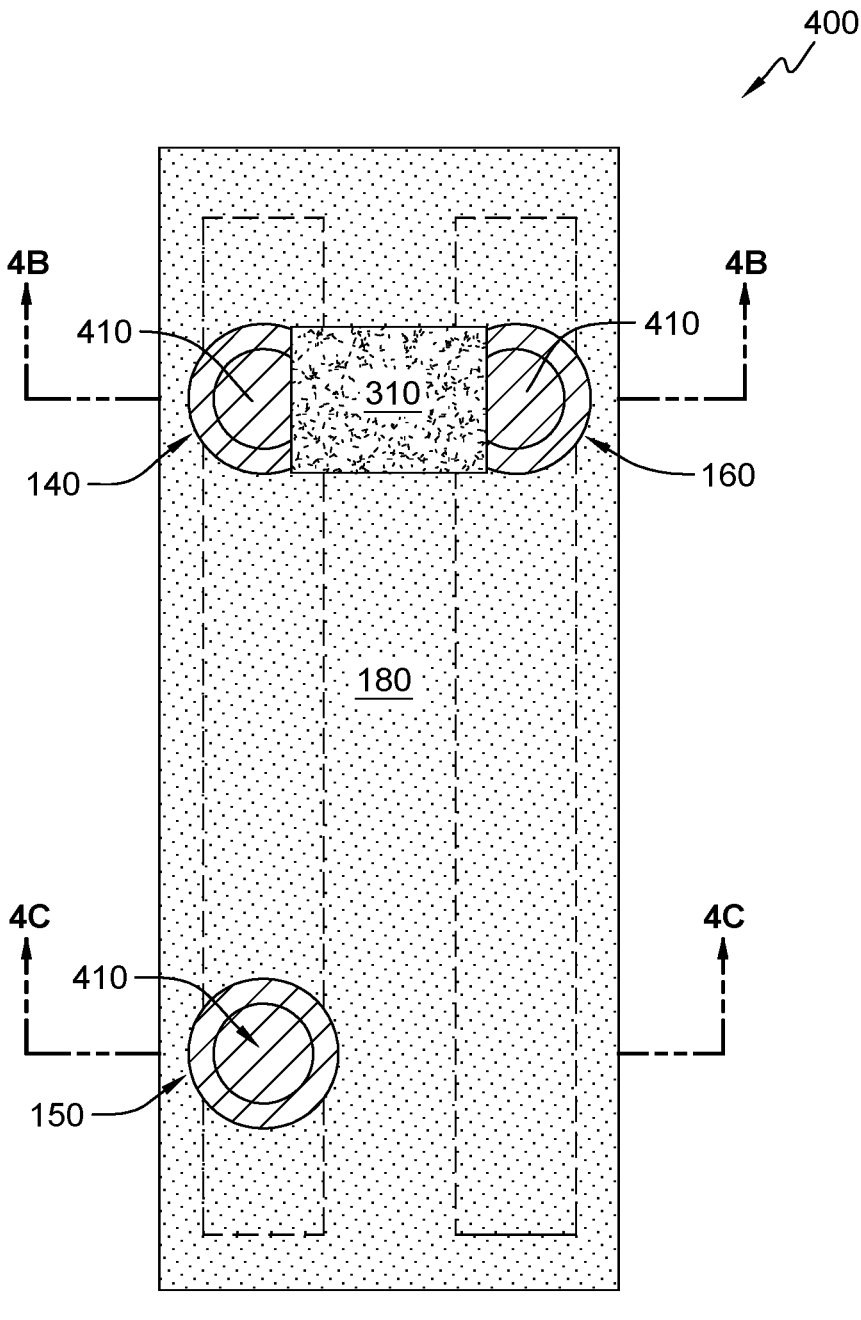
FIG. 4A illustrates a top view of semiconductor structure 300 after performing subsequent processing steps, generally designated 400, in accordance with at least one embodiment of the present invention.
Figure 4B:
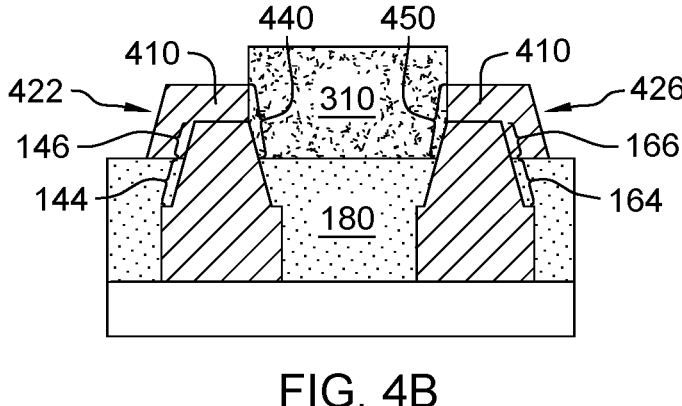
FIG. 4B illustrates a cross-sectional view of semiconductor structure 400 taken along line 4B, in accordance with at least one embodiment of the present invention.
Figure 4C:
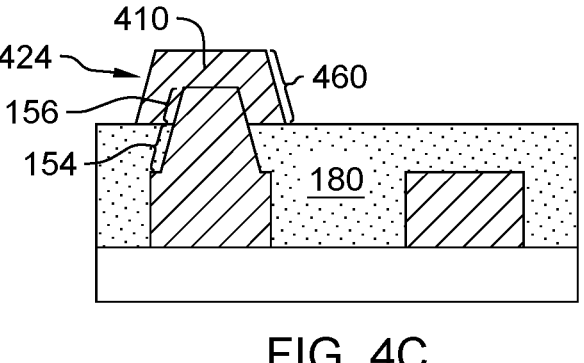
FIG. 4C illustrates a cross-sectional view of semiconductor structure 400 taken along line 4C, in accordance with at least one embodiment of the present invention.

FIGS. 4A-4C illustrate a plan view and corresponding cross-sectional views of semiconductor structure 300 depicted in FIGS. 3A-3C after performing subsequent processing steps, generally designated 400, in accordance with at least one embodiment of the present invention. In assembly of semiconductor structure 400, and referring to the top view of FIG. 4A and the cross-sectional views of FIGS. 4B, 4C taken along corresponding lines 4B, 4C, a conductive metal material 410 is selectively grown on the exposed metal surfaces of top portions 146, 156, 166 of vias 140, 150, 160 to form selective growth regions 422, 424, 426.

Selective growth regions 422, 424, 426 enlarge top portions 144, 156, 166 of vias 140, 150, 160 in one or more directions. As depicted, the resulting combination of top portions 146, 156, 166 of vias 140, 150, 160 and selective growth regions 422, 424, 426 form enlarged top portions 446, 456, 466 of vias 140, 150, 160. As further depicted, selective growth regions 422, 426 of enlarged top portions 446, 466 overhang bottom portions 144, 164 of vias 140, 160 in one or more directions, while selective growth region 424 of enlarged top portion 456 overhangs bottom portion 154 of via 150 in all directions (i.e., 360 degrees). Due to the particular arrangement of block mask 310, it can be seen that the direction of the selective growth of conductive metal material 410 is controlled such that the resulting enlarged top portions 146, 166 of vias 140, 160 provide for an increased via to line contact area without violating the minimum required pitch (and without reducing the distance) between vias 140, 160.

Top portions 146, 156, 166 of vias 140, 150, 160 may be selectively enlarged in one or more directions by performing, for example, area-selective atomic layer deposition (ALD) of conductive metal material 410 onto the exposed metal surfaces of top portions 146, 156, 166 of vias 140, 150, 160. The area-selective ALD results in a bottom-up process in which conformal thin layers of metal material 410 are selectively deposited on top of one another, such that the deposition of each layer of metal material 410 results in both a lateral growth extending from the exposed sidewalls 148, 158, 168 of top portions 146, 156, 166 of vias 140, 150, 160, and a vertical growth extending from a top surface of top portions 146, 156, 166 of vias 140, 150, 160. Conductive metal material 410 of selective growth regions 422, 424, 426 may be any conductive metal material that is selective to the material of top portions 146, 156, 166 of vias 140, 150, 160 over the materials of ILD layer 180 and mask layer 310. In some embodiments, and as depicted, selective growth regions 422, 424, 426 and top portions 146, 156, 166 of vias 140, 150, 160 are formed from the material(s). In other embodiments, selective growth regions 422, 424, 426 and top portions 146, 156, 166 of vias 140, 150, 160 are formed from different materials.

It should be appreciated that due to the particular arrangement of block mask 310 with respect to vias 140, 160, the enlargement of top portions 146, 166 of vias 150, 160 can be selectively controlled in a particular directional range such that the distance between vias 140, 160 remains unchanged after the formation of selective growth regions 422, 426.

Figure 5A:
FIG. 5A illustrates a top view of semiconductor structure 400 after performing subsequent processing steps, generally designated 500, in accordance with at least one embodiment of the present invention.
Figure 5A:
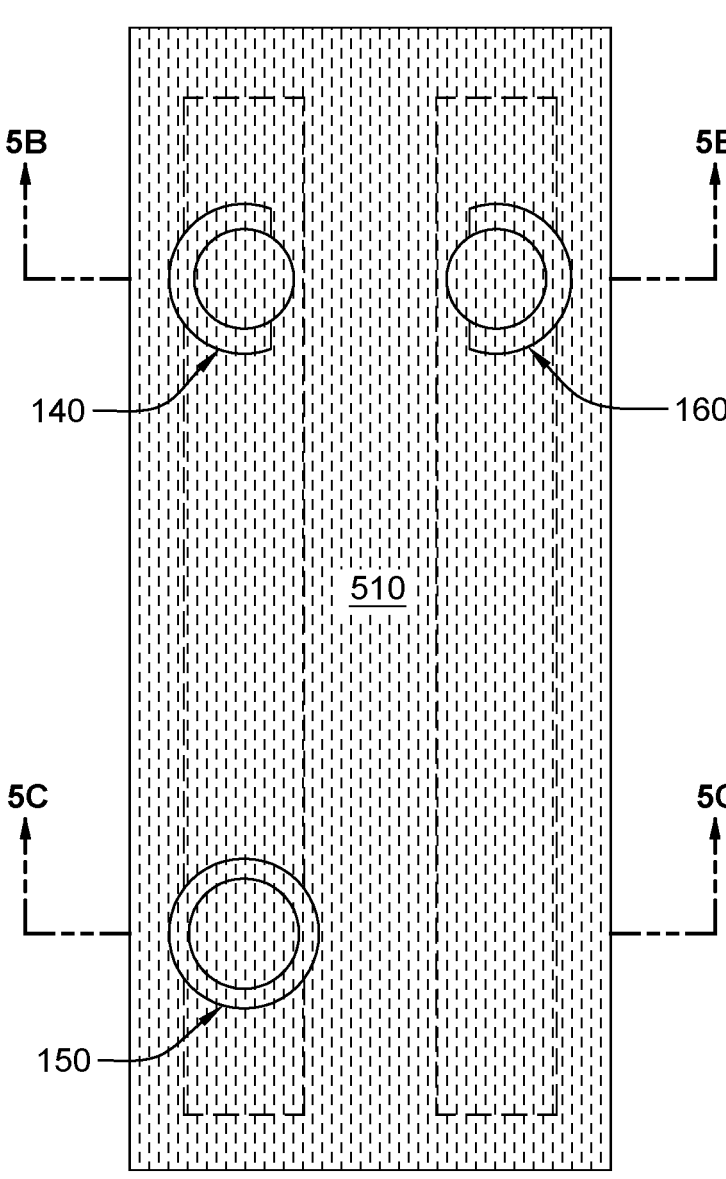
Figure 5B:
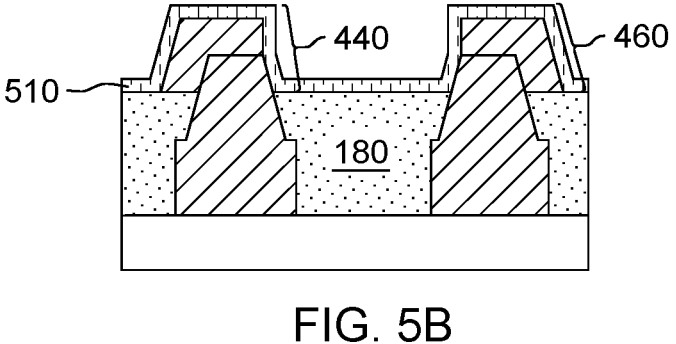
FIG. 5B illustrates a cross-sectional view of semiconductor structure 500 taken along line 5B, in accordance with at least one embodiment of the present invention.
Figure 5C:
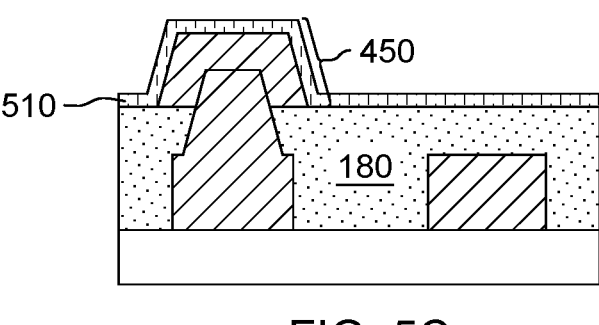
FIG. 5C illustrates a cross-sectional view of semiconductor structure 500 taken along line 5C, in accordance with at least one embodiment of the present invention.

FIGS. 5A-5C illustrate a plan view and corresponding cross-sectional views of semiconductor structure 400 depicted in FIGS. 4A-4C after performing subsequent processing steps, generally designated 500, in accordance with at least one embodiment of the present invention. In assembly of semiconductor structure 500, and referring to the top view of FIG. 5A and the cross-sectional views of FIGS. 5B, 5C taken along corresponding lines 5B, 5C, block mask 310 has been removed, and an optional protective liner 510 is formed along the surface of semiconductor structure 400.

The optional protective liner 510 may be formed by conformally depositing a protective liner material on the exposed surfaces semiconductor structure 400, including the surfaces of ILD layer 180 and enlarged top portions 440, 450, 460 of vias 140, 150, 160. Protective liner 510 may include one or more thin layers of a metal barrier material such as, for example, tantalum (Ta), tantalum nitride (TaN), titanium nitride (TiN), hafnium nitride (HfN), cobalt (Co), ruthenium (Ru), tungsten (W), tungsten nitride (WN), titanium-tungsten (TiW), tungsten nitride (WN) manganese (Mn), manganese nitride (MnN) or other barrier materials (or combinations of barrier materials) such as RuTaN, Ta/TaN, CoWP, NiMoP, or NiMoB which are suitable for the given application. The thin protective liner 510 serves as a barrier diffusion layer and adhesion layer. A conformal layer of a metal barrier material may be deposited using known techniques including, but not limited to, chemical vapor deposition (CVD), plasma enhanced chemical vapor deposition (PECVD), atomic layer deposition (ALD), physical vapor deposition (PVD), sputtering, chemical solution deposition or plating. The thickness of protective liner 510 may vary depending on the deposition process used, as well as the material employed. In some embodiments, protective liner 510 may have a thickness from 2 nm to 50 nm. However, other thicknesses that are less than 2 nm, or greater than 50 nm can also be employed in embodiments of the present invention.

In some embodiments, an optional plating seed layer (not depicted) can be formed on protective liner 510 as well. The optional plating seed layer is employed to selectively promote subsequent electroplating of a pre-selected conductive metal or metal alloy. The optional plating seed layer may be composed of Cu, a Cu alloy, Ir, an Ir alloy, Ru, a Ru alloy (e.g., TaRu alloy) or any other suitable noble metal or noble metal alloy having a low metal-plating overpotential. Typically, a Cu or Cu alloy plating seed layer is employed when a Cu metal is to be subsequently formed within the trenches. The optional plating seed layer can be formed by a conventional deposition process including, for example, CVD, PECVD, ALD, or PVD. The thickness of the optional plating seed layer may vary depending on the material of the optional plating seed layer, as well as the technique used in forming the same. Typically, the optional plating seed layer may have a thickness from 2 nm to 80 nm. However, other thicknesses that are less than 2 nm, or greater than 80 nm can also be employed in embodiments of the present invention.

Figure 6A:
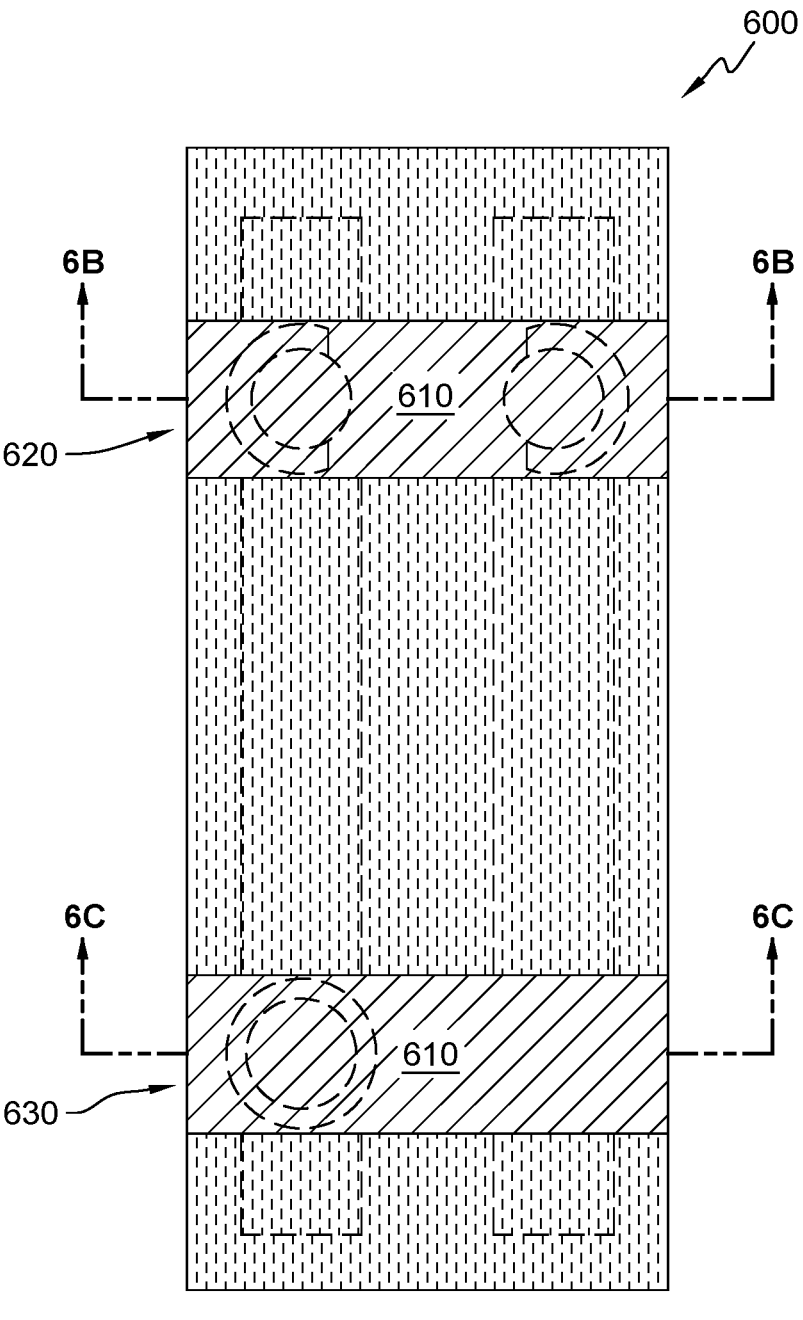
FIG. 6A illustrates a top view of semiconductor structure 500 after performing subsequent processing steps, generally designated 600, in accordance with at least one embodiment of the present invention.
Figure 6B:
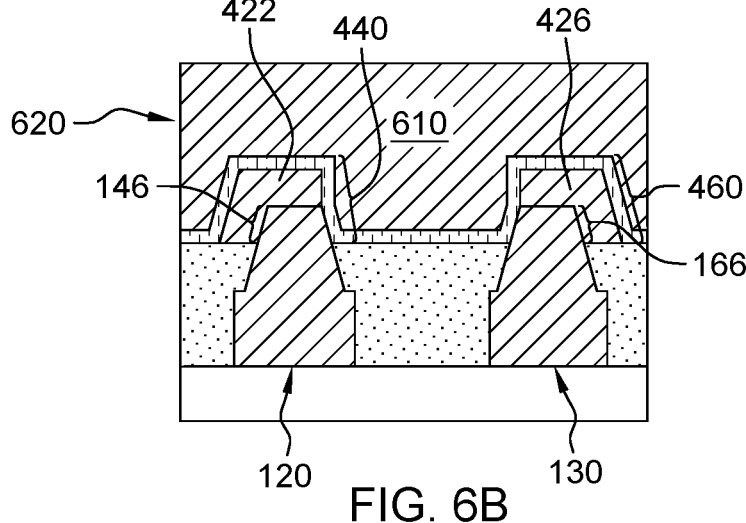
FIG. 6B illustrates a cross-sectional view of semiconductor structure 600 taken along line 6B, in accordance with at least one embodiment of the present invention.
Figure 6C:
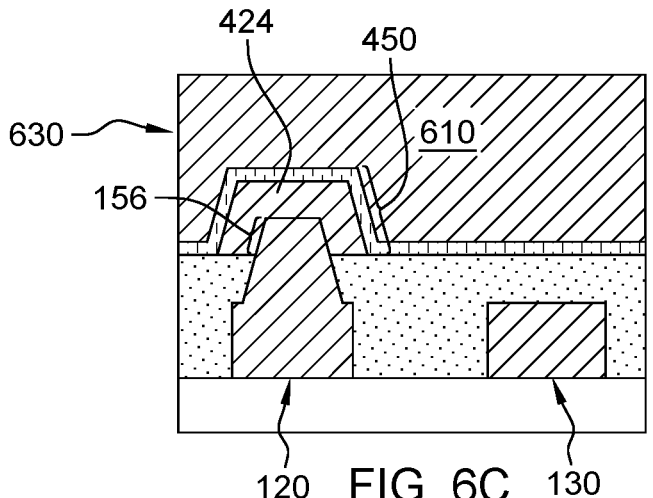
FIG. 6C illustrates a cross-sectional view of semiconductor structure 600 taken along line 6C, in accordance with at least one embodiment of the present invention.

FIGS. 6A-6C illustrate a top view and corresponding cross-sectional views of semiconductor structure 500 after performing subsequent processing steps, generally designated 600, in accordance with at least one embodiment of the present invention. In assembly of semiconductor structure 600, and referring to the top view of FIG. 6A and the cross-sectional views of FIGS. 6B, 6C taken along corresponding lines 6B, 6C, upper level metal lines 620, 630 are formed on top of selective growth regions 422, 424, 426 of enlarged top portions 446, 456, 466 of vias 140, 150, 160, respectively. In some embodiments, upper level metal lines 620, 630 may be formed by depositing a conductive metal material (e.g., any of the conductive metal materials used to form vias 140, 150, 160 as previously discussed above with reference to FIGS. 1A-1C) and patterning the conductive metal material using one or more subtractive etch processes. In other embodiments, upper metal level lines 620, 630 may be formed as part of a single damascene process or dual damascene process as known by one of ordinary skill in the art and, as such, a more detailed description of such processes is not presented herein.

As depicted by FIGS. 6A-6C, upper level metal line 620 is formed on top of selective growth regions 422, 426 and runs in a direction that is perpendicular to lower level metal lines 120, 130. Upper level metal line 620 is formed on top of selective growth region 424 of via 150 and also runs in a direction that is perpendicular to lower level metal lines 120, 130. As further depicted, enlarged top portions 440, 450, 460 of vias 140, 150, 160, which include the original top portions 146, 156, 166 and selective growth regions 422, 424, 426, are at least partially recessed within upper level metal lines 620, 630, respectively. In some embodiments, and as depicted, upper level metal lines 620, 630 are formed from the same material(s) as lower level metal lines 120, 130. In other embodiments, upper level metal lines 620, 630 and lower level metal lines 120, 130 are formed from different materials.

It should be appreciated that selective growth regions 422, 424, 426 provide for increased via to line contact area between vias 140, 150, 160 and upper level metal lines 620, 630 without violating the minimum required pitch or distance between vias 140, 150, 160. Thus, the amount of contact resistance between vias 140, 150, 160 and upper level metal lines 620, 630 is reduced while preserving the TDDB integrity of semiconductor structure 600.

FIG. 7 is a method of fabricating a semiconductor interconnect structure, generally designated 700, in accordance with at least one embodiment of the present invention. The method 700 may be used in conjunction with other embodiments, for example, any of the exemplary fabrication sequences of FIGS. 1A-1D . . . FIGS. 6A-6D.

The method optionally begins at block 702, where a via is formed on top of a first metal line. Forming the via on top of the first metal line comprises (at block 704) depositing a first conductive metal material onto a substrate, and (at block 706) performing one or more subtractive etch processes to pattern the first conductive metal material into the first metal line and the via formed thereon.

At block 708, an interlayer dielectric (ILD) is deposited to form an ILD layer. Forming the ILD layer comprises (at block 710) conformally depositing an ILD material onto the first metal line and via, (at block 712) removing any ILD material formed above a top surface of the via, and (at block 714) partially recessing the ILD layer below the top surface of the via.

At block 716, a top portion of the via located above the ILD layer is enlarged in one or more directions. Enlarging the top portion of the via in one or more directions comprises (at block 718) depositing a mask material and patterning the mask material to form a block mask, wherein the block mask covers a first portion of the top portion of the via, and (at block 722) depositing, using area selective deposition, a second conductive metal material onto a second portion of the top portion of the via left exposed by the block mask to form a selective growth region.

At block 724, a second metal line is formed on top of the selective growth region of the via. Forming the second metal line comprises (at block 726) optionally conformally depositing a barrier material to form a protective liner, depositing (at block 728) a third conductive metal material onto the protective liner, and (at block 730) performing one or more subtractive etch processes to pattern the third conductive metal material into the second metal line. Alternatively, the second metal line may be formed on top of the selective growth region of the via by performing a single or dual damascene process as known by one of ordinary skill in the art.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A semiconductor interconnect structure, comprising:
   a via located on top of a lower level metal line, wherein the via includes a bottom portion and a top portion; and
   an arc-shaped region located on the top portion of the via, wherein the arc-shaped region overhangs the bottom portion of the via, and wherein the arc-shaped region is visible from a top view of the semiconductor interconnect structure.

2. The semiconductor interconnect structure of claim 1, further comprising:
   an upper level metal line located on top of the arc-shaped region, wherein the arc-shaped region and the top portion of the via are recessed within the upper level metal line.

3. The semiconductor structure of claim 2, wherein the upper level metal line direction runs perpendicular to the lower level metal line direction.

4. The semiconductor structure of claim 2, wherein the via electrically connects the lower level metal line to the upper level metal line.

5. The semiconductor structure of claim 1, wherein:
   the bottom portion of the via is recessed within, and located below a top surface of an interlayer dielectric layer; and
   the top portion of the via is located above the top surface of the inter layer dielectric layer.

6. The semiconductor interconnect structure of claim 1, wherein the arc-shaped region located on the top portion of the via and the top portion of the via are formed from a same conductive metal material.

7. The semiconductor interconnect structure of claim 1, wherein the arc-shaped region located on the top portion of the via and the top portion of the via are formed from different conductive metal materials.

8. The semiconductor interconnect structure of claim 1, wherein the lower level metal line and the via comprise a conductive metal material selected from the group consisting of aluminum (Al), ruthenium (Ru), rhodium (Rh), iridium (Ir), tungsten (W), molybdenum (Mo), nickel (Ni), and an alloy thereof.

9. The semiconductor interconnect structure of claim 1, wherein the arc-shaped region comprises a conductive metal material selected from the group consisting of copper (Cu), aluminum (Al), ruthenium (Ru), rhodium (Rh), iridium (Ir), tungsten (W), molybdenum (Mo), nickel (Ni), and an alloy thereof.

10. A method of forming a semiconductor interconnect structure, comprising:
  forming a via on top of a lower level metal line, wherein the via includes a bottom portion and a top portion; and
  forming an arc-shaped region on the top portion of the via, wherein the arc-shaped region overhangs the bottom portion of the via, and wherein the arc-shaped region is visible from a top view of the semiconductor interconnect structure.

11. The method of claim 10, wherein forming the via on top of the lower metal line comprises:
  depositing a conductive metal material onto a substrate; and
  performing one or more subtractive etch processes to pattern the conductive metal material into the lower level metal line and the via formed on top thereof.

12. The method of claim 10, further comprising forming an interlayer dielectric layer, wherein forming the interlayer dielectric comprises:
  depositing an interlayer dielectric material onto the lower level metal line and the via; and recessing the interlayer dielectric material below the top surface of the via.

13. The method of claim 10, wherein forming the arc-shaped region on the top portion of the via comprises:
  forming a block mask onto a first portion of the top portion of the via; and
  depositing, using area selective deposition, a conductive metal material onto a second portion of the top portion of the via left exposed by the block mask.

14. The method of claim 13, wherein the conductive metal material is selective to a material of the top portion of the via over a material of the block mask.

15. The method claim 13, wherein the arc-shaped region and the top portion of the via comprise a same conductive metal material.

16. The method of claim 13, wherein the arc-shaped region and the top portion of the via comprise different conductive metal materials.

17. The method of claim 13, wherein the arc-shaped region comprises a conductive metal material selected from the group consisting of copper (Cu) aluminum (Al), ruthenium (Ru), rhodium (Rh), iridium (Ir), tungsten (W), molybdenum (Mo), nickel (Ni), and an alloy thereof.

18. The method of claim 10, wherein the lower level metal line and the via comprise a conductive metal material selected from the group consisting of aluminum (Al), ruthenium (Ru), rhodium (Rh), iridium (Ir), tungsten (W), molybdenum (Mo), nickel (Ni), and an alloy thereof.

* * * * *